(12) United States Patent
Kuzumaki et al.

(10) Patent No.: US 7,016,749 B2
(45) Date of Patent: Mar. 21, 2006

(54) SYSTEM AND METHOD FOR PRODUCT DESIGNING, AND RECORDING MEDIUM

(75) Inventors: Seigo Kuzumaki, Nagoya (JP); Yoshio Shirai, Okazaki (JP); Takatoshi Negishi, Nagoya (JP); Kazuhiro Miyauchi, Toyota (JP); Masato Kato, Nagoya (JP); Katsuhiko Kato, Nisshin (JP); Yasushi Okamoto, Okazaki (JP); Shouichi Okumura, Aichi-ken (JP); Mikio Sato, Nagoya (JP); Yoshiki Konishi, Tokoname (JP); Morio Oba, Gamagoori (JP); Koji Sato, Seto (JP); Junichi Harada, Aichi-ken (JP); Shigeharu Ueyama, Toyota (JP); Koji Eguchi, Seto (JP); Goro Takahashi, Owariasahi (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 639 days.

(21) Appl. No.: 10/267,569

(22) Filed: Oct. 10, 2002

(65) Prior Publication Data

US 2003/0115026 A1    Jun. 19, 2003

(30) Foreign Application Priority Data

Oct. 10, 2001  (JP) ............................. 2001-312295
Oct. 10, 2001  (JP) ............................. 2001-312296
Oct. 10, 2001  (JP) ............................. 2001-312297
Oct. 10, 2001  (JP) ............................. 2001-312298

(51) Int. Cl.
   *G06F 19/00*    (2006.01)
(52) U.S. Cl. ...................... 700/97; 703/1; 700/105; 700/182; 705/27

(58) Field of Classification Search ................ 700/28, 700/95, 97, 105, 107, 182; 703/1; 705/1, 705/7, 10, 27, 29
See application file for complete search history.

(56) References Cited

U.S. PATENT DOCUMENTS 5,806,069 A * 9/1998 Wakiyama et al. ......... 707/102

(Continued)

FOREIGN PATENT DOCUMENTS

JP       6-149944       5/1994

OTHER PUBLICATIONS

Hiroshi Nakajima et al., "System For Supporting Reuse Of History Records Of Design Work" U.S. Appl. No. 9/964,421, filed Sep. 28, 2001.
Yasuyuki Anami et al., "Design Support System Facilitating Process Modification", U.S. Appl. No. 09/960,415, filed Sep. 24, 2001.
Yasuyuki Anami et al., "Design Support System With Improved Reusability Of Work History Data And Design Support Method", U.S. Appl. No. 10/046,715, filed Jan. 17, 2002.

*Primary Examiner*—Leo Picard
*Assistant Examiner*—Sheela S. Rao
(74) *Attorney, Agent, or Firm*—Finnegan, Henderson, Farabow, Garrett & Dunner, LLP

(57) ABSTRACT

A product design CAD data reconstruction unit 50 reconstructs product design CAD data used for product evaluation regarding an initial design so as to fulfill restrictive conditions obtained from the product evaluation based on a product structure for the initial design. The reconstructed product design CAD data is stored in a product design CAD data database 90. Upon reception of a corrected design obtained by correcting the initial design, the product design CAD data for the initial design is read from the product design CAAD data database 90, and the product design CAD data is corrected along a design surface of the corrected design.

25 Claims, 17 Drawing Sheets

U.S. PATENT DOCUMENTS

| | | | |
|---|---|---|---|
| 6,882,893 B1 * | 4/2005 | Uchida et al. | 700/98 |
| 6,223,092 B1 * | 4/2001 | Miyakawa et al. | 700/103 |
| 6,557,002 B1 * | 4/2003 | Fujieda et al. | 707/102 |
| 6,725,184 B1 * | 4/2004 | Gadh et al. | 703/2 |

* cited by examiner

| STRUCTURE | MATERIAL | RESTRICTIVE CONDITIONS | REASON | TYPE OF CONDITIONS |
|---|---|---|---|---|
| RIB | ABS | RIB BASE PLATE THICKNESS W≦0.6T (T=SUBSTRATE PLATE THICKNESS) | PREVENT SURFACE SINKING | DESIRED CONDITIONS |
| RIB | PP | W≦0.5T | PREVENT SURFACE SINKING | DESIRED CONDITIONS |
| ⋮ | ⋮ | ⋮ | ⋮ | ⋮ |

| PRODUCT ID | PRODUCT NAME | PRODUCT DESIGN PARAMETER |
|---|---|---|
| S001 | INSTRUMENT PANEL A | R001 |
| S002 | INSTRUMENT PANEL B | R002 |
| S003 | INSTRUMENT PANEL C | R003 |
| S004 | INSTRUMENT PANEL D | R004 |
| S005 | DASH BOX A | R005 |
| S006 | DASH BOX B | R006 |
| S007 | DASH BOX C | R007 |
| S008 | DASH BOX D | R008 |
| S009 | CUP HOLDER A | R009 |
| S0010 | CUP HOLDER B | R0010 |
| S0011 | CUP HOLDER C | R0011 |

FIG. 13

| PRODUCT ID | PRODUCT NAME | MOLD COMPONENT ID |
|---|---|---|
| S001 | INSTRUMENT PANEL A | K012, K020 |
| S002 | INSTRUMENT PANEL B | K012, K021 |
| S003 | INSTRUMENT PANEL C | K012, K022 |
| S004 | INSTRUMENT PANEL D | K012, K023 |

| MOLD COMPONENT ID | MOLD COMPONENT NAME | INDIVIDUAL NAME | MOLD DESIGNING PARAMETER |
|---|---|---|---|
| K001 | RUNNER GATE A | VLAVE GATE | P001 |
| K002 | RUNNER GATE B | HOT RUNNER | P002 |
| K003 | RUNNER GATE C | COLD RUNNER | P003 |
| K004 | UNDERCUT PROCESSING MOLD STRUCTURE COMPONENT A | SLIDE CORE | P004 |
| K005 | UNDERCUT PROCESSING MOLD STRUCTURE COMPONENT B | INCLINED CORE | P005 |
| K006 | MOLD COOLING COMPONENT | WATER HOLE | P006 |
| K007 | EXTRUSION MOLD STRUCTURE COMPONENT A | EXTRUSION CORE | P007 |
| K008 | EXTRUSION MOLD STRUCTURE COMPONENT B | EXTRUSION PIN | P008 |
| K009 | EXTRUSION MOLD STRUCTURE COMPONENT C | SLEEVE PIN | P009 |
| K0010 | EXTRUSION MOLD STRUCTURE COMPONENT D | AUTOMATIC DROP PIN | P0010 |
| K0011 | MOLDING MACHINE | MOLDING MACHINE ATTACHED | P0011 |

FIG. 16

SYSTEM AND METHOD FOR PRODUCT DESIGNING, AND RECORDING MEDIUM

BACKGROUND OF THE INVENTION

1. Field of the Invention

The present invention relates to a system and a method for designing a product. More particularly, the invention relates to a system and a method capable of performing product design based on a result of structural analysis of a product.

2. Description of the Related Art

In vehicle designing, CAD has widely been used for design and manufacture, structural design, structural analysis, and other uses. FIG. 1 shows a conventional vehicle design process. First, CAD data of an initial design as a basis is entered (S10). Based on this initial design, product design of each component is performed to generate CAD data for product design (S20). Then, by using the CAD data for product design, structural analysis, productivity evaluation, and mold design are carried out (S30). The CAD data for product design is corrected by incorporating results of a structural analysis (S40). When correction is added to the initial design, and a design is finalized, CAD data of the final design is newly entered (S50). Based on this final design CAD data, as in the case of the initial design CAD data, CAD data for product design is generated (S60), and then structural analysis is carried out by using the CAD data for product design (S70). After correction of the CAD data for product design created by incorporating a result of evaluating the structural analysis (S80), a mold is prepared based on the obtained CAD data for product designing (S90).

In the foregoing case, the initial design was corrected once to obtain the final design. In the case of repeated corrections added in a process from an initial design to a final design, however, generation of CAD data for product designing and structural analysis, and correction of the CAD data for product design based on the structural analysis are sequentially carried out each time.

Conventionally, product evaluation by structural analysis based on design CAD data has been repeatedly carried out for each correction of the design CAD data. Each addition of correction to the design has required time for structural analysis. This prolongs the vehicle design process and increases costs.

The present invention was made to solve the above-described problem, and objects of the invention include providing a system and a method for product design, and a recording medium.

SUMMARY OF THE INVENTION

When generating product design CAD data for a corrected design using the present invention, reconstructed CAD data for product design incorporating information obtained through product evaluation is used for an initial design. Accordingly, it is not necessary to make any new product evaluation for the corrected design. Thus, the process up to preparation of a mold can be simplified.

For each component of a product, a standard model may be prepared, which includes standard structure data, design procedure data, and continuous part structure information regarding a structure of a joined portion and a structure of an opposite side of the joined portion. When two components to be joined together are selected, a structure of a joined portion of the second component may be corrected according to the continuous part structure information included in the standard model of the first component. Thus, it is possible to save time and labor of correcting the structure of one component according to the structure of the other component.

A knowledge information storage unit may be provided, which stores designing procedure information for various products, and conditions of a production technology. The design procedure of a product to be designed and the conditions may be read, structural designing may be carried out based on a product design and corresponding design procedure information, determination may be made as to whether the designed structure fulfills the conditions or not, and, then, a result of the determination may be informed to the user. Thus, it is possible to perform efficient product designing with addition of the conditions on the product structure.

Furthermore, a design information storage unit for storing product design information for each product, and a mold design information storage unit for storing mold design information of each product may be provided. When designing a product, a mold may be designed based on a product structure based on the product designing information and the mold designing information by reading the product design information from the design information storage unit and the mold design information from the mold design information storage unit. Thus, it is possible to shorten the time required for processes from product design through mold design.

BRIEF DESCRIPTION OF THE DRAWINGS

FIG. 9 is a view showing a restrictive conditions table 342 stored in a knowledge information storage unit 340.

FIG. 13 is a view showing an example of a product table 442 included in a product design information storage unit 440.

FIG. 15 is a view showing an example of a standard mold table 482 included in a mold design information storage unit 480.

FIG. 16 is a view showing an example of a mold component table 484 included in the mold design information storage unit 480.

DESCRIPTION OF THE PREFERRED EMBODIMENTS

Next, preferred embodiments of the present invention will be described.

Figure 1:
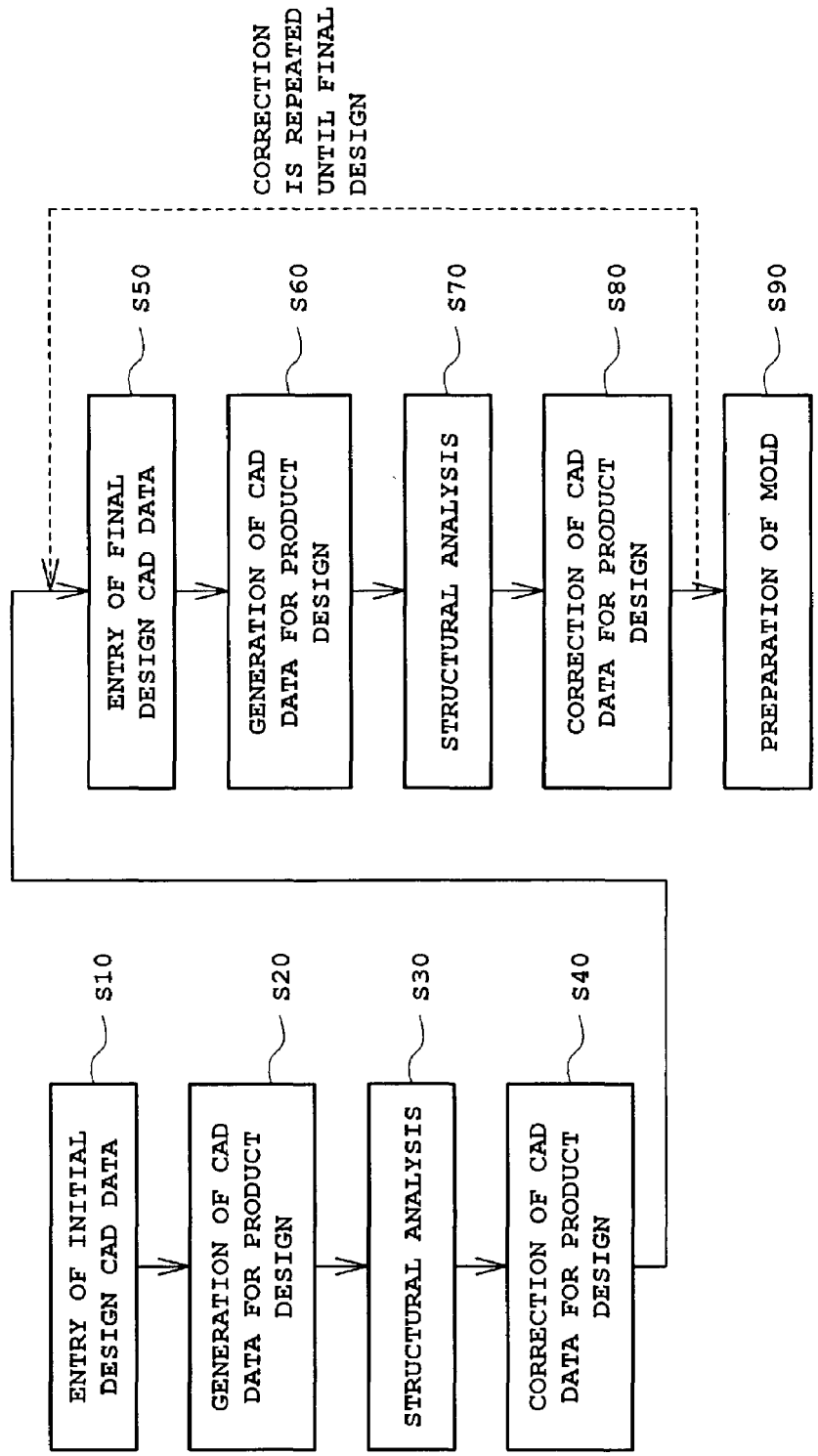
FIG. 1 is a view showing a conventional vehicle design procedure.
Figure 2:
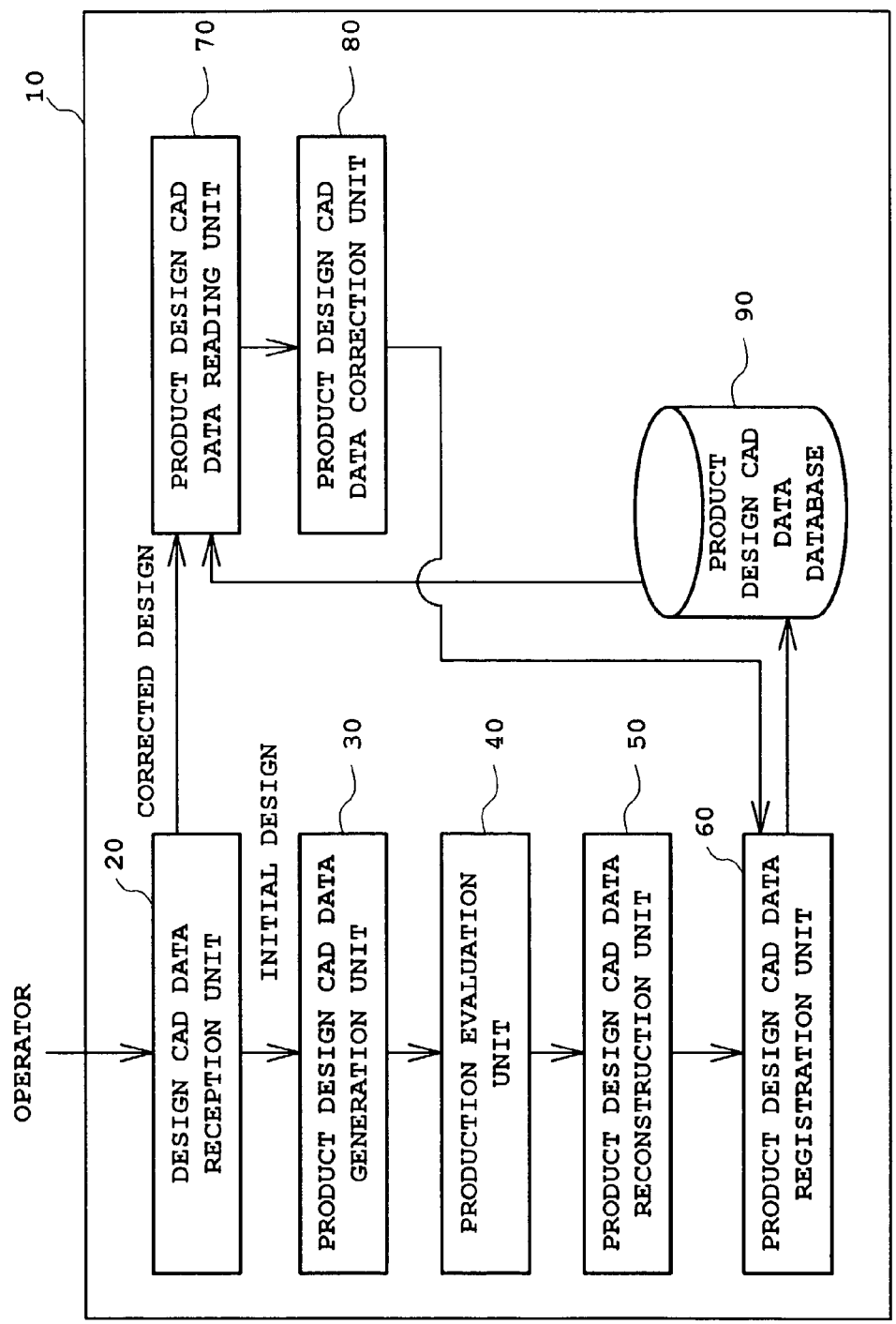
FIG. 2 is a block diagram showing a configuration of a product design system 10 according to an embodiment of the present invention.

FIG. 2 is a block diagram showing a configuration of a product design system 10 according to an embodiment. The product design system 10 includes a design CAD data reception unit 20, a product design CAD data generation unit 30, a product evaluation unit 40, a product design CAD data reconstruction unit 50, a produce design CAD data registration unit 60, a product design CAD data reading unit 70, a product design CAD data correction unit 80, and a product design CAD data database 90.

The design CAD data reception unit 20 receives design CAD data representing a design of a vehicle (example of a product) from an operator through an input device such as a mouse, a keyboard or the like, not shown.

If the received design CAD data is data for an initial design, the product design CAD data generation unit 30 generates product design CAD data defining a structure of a product (entire vehicle, or a part of a vehicle, e.g., door) based on the initial design CAD data. More specifically, product design is carried out along a design surface of the initial design CAD data by using design procedure information (including information on a position defined by a relation between parts of the product, or a relationship between the product and anther product, size, or the like) indicating a suitable design procedure carried out in the past for the product, whose initial design CAD data has been created. Accordingly, product design CAD data is obtained. Thus, the product design CAD data has an outer shape set according to the initial design CAD data, and optimal values obtained from the past execution as initial parameters for respective specifications such as a plate thickness, and an attaching angle of each member of the product. Also, the above-described design procedure information is contained in the product design CAD data.

The product evaluation unit 40 executes product evaluation such as structural analysis, mold design evaluation and process/equipment evaluation for the product design CAD data generated at the product design CAD data generation unit 30 corresponding to the initial design. Here, structural analysis refers to simulation of strength, rigidity, or vibration of the product on a computer based on the product design CAD data; mold design evaluation here refers to simulation of mold design of the product from the product design CAD data, and evaluation of a possibility of a mold of the product; process/equipment evaluation refers to simulation of a process/equipment necessary for product manufacturing from the product design CAD, and evaluation of problems in the process/equipment.

In addition to the structural analysis, the mold design evaluation and the process/equipment evaluation, the product evaluation unit 40 may check whether any inconvenience occurs by an outer shape formed according to the initial design CAD data, and make corrections to create a design causing no inconvenience when found necessary. In such case, the discovered and corrected inconvenience of the design may be warned to the operator. For example, in vehicle design, if a position or a width of a front pillar in the initial design would impair driver visibility, the position or width of the front pillar is may be corrected to improve visibility, and design correction notified to the CAD operator. Accordingly, when the initial design is corrected by the operator, correction can be made based on the initial design having been subjected to design-correction to prevent a visibility problem. Thus, it is possible to prevent such a visibility problem in the design corrected by the operator.

The product design CAD data reconstruction unit 50 adds restrictive conditions of product design obtained by evaluation by the product evaluation unit 40 to the design procedure information, and reconstructs the product design CAD data so as to fulfill the restricting conditions on the product design. Regarding the restricting conditions, for example, in the case that the product component is too complicated to execute injection molding in the mold design evaluation, further simplification of a component structure may become a restricting condition. Additionally, in the case that a result of the structure analysis shows a shortage of the product strength, reinforcement of the structural strength may become a restricting conditions. Moreover, in the case that a result of the process/equipment evaluation shows difficulty of execution, achievement of realizable structure regarding a process/equipment becomes the restrictive conditions.

Figure 3:
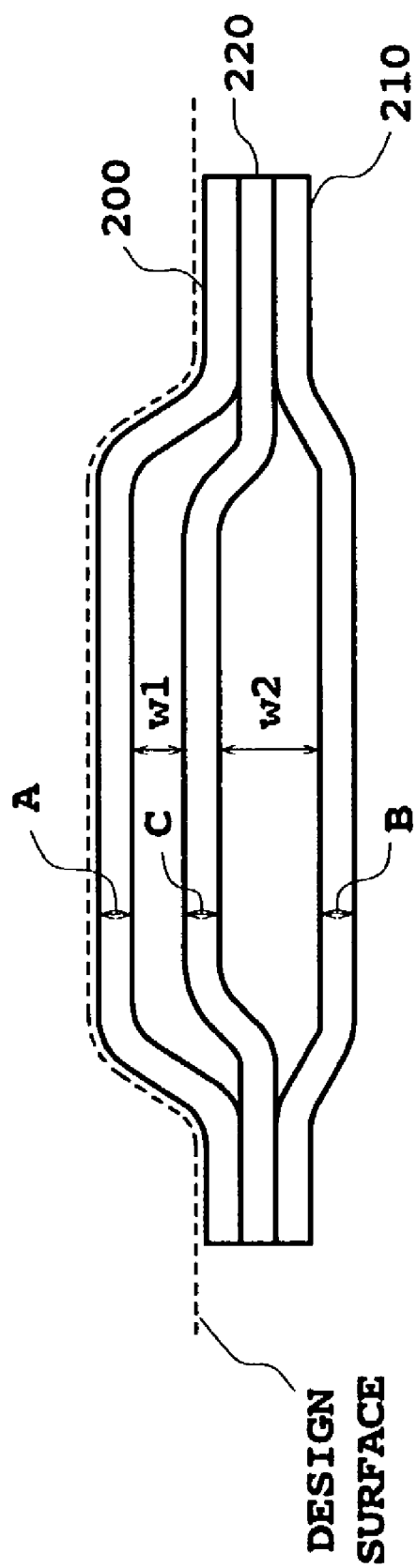
FIG. 3 is a sectional view of a center pillar to be designed.

Next, an example of reconstruction of the product design CAD data will described referring to FIG. 3. As an example of a product to be designed, a center pillar of a vehicle is shown. FIG. 3 is a sectional view of the center pillar. The center pillar includes an outer portion 200 facing outward, an inner portion 210 facing inward, and a reinforcing material 220 for reinforcing the strength of the center pillar. The dotted line in FIG. 3 indicates a design surface defined by the initial design CAD data. The product design CAD data generated based on the initial design CAD data defines a plate thickness A of the outer portion 200, a plate thickness B of the inner portion 210, a plate thickness C of the reinforcing material 220, a space W1 between the outer portion 200 and the reinforcing material 220, and a space W2 between the inner portion 210 and the reinforcing material 220. When a result of the structural analysis for the product design CAD data shows that the pillar has insufficient strength, thick plate setting (C+α) of the reinforcing material 220 becomes a restricting condition. Accordingly, the thick plate setting C+α of the reinforcing material 220, reconstruction of the product design CAD data is carried out to fulfill the restricting condition, such as defining of a space between the outer portion 200 and the reinforcing material 220 to W1−α.

Returning to FIG. 2, the product design CAD data registration unit 60 registers the reconstructed product design CAD data in the product design CAD data database 90.

If the received design CAD data is a corrected design, i.e., a result of correcting the initial design, the product design CAD data reading unit 70 reads the reconstructed product design CAD data for the initial design from the product design CAD data database 90.

The product design CAD data correction unit 80 corrects the reconstructed product design CAD data read from the product design CAD data database 90 along a design surface of the corrected design so as to fulfill the restricting conditions.

Figure 4:
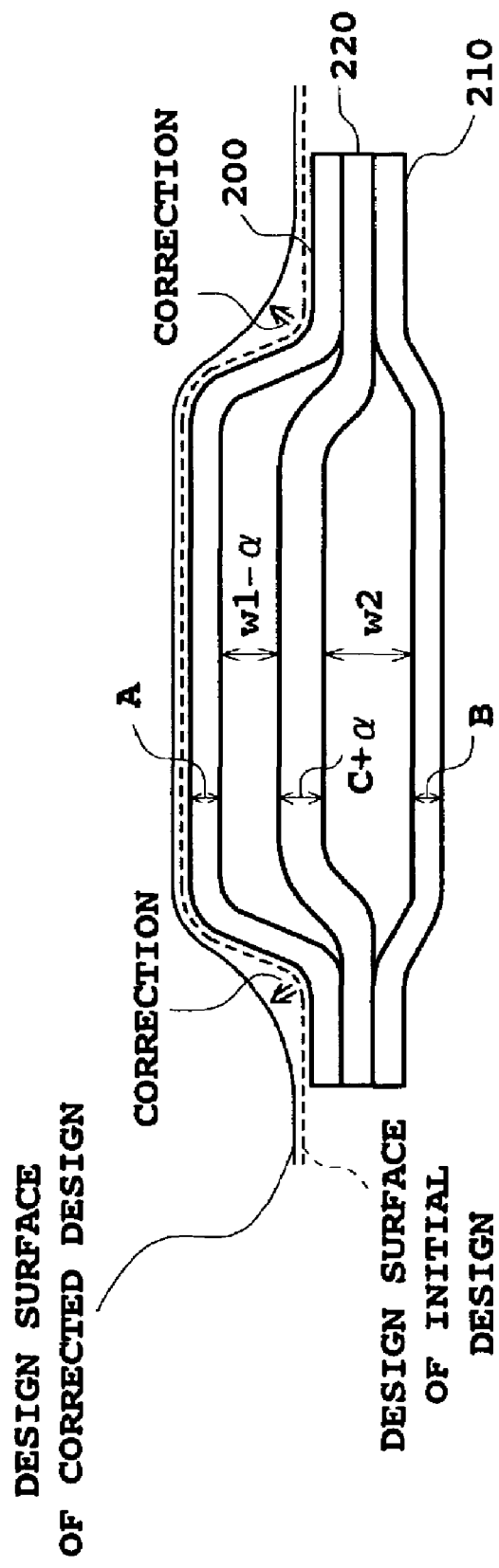
FIG. 4 is a sectional view after reconstruction of product design CAD data for the center pillar.

Next, an example of correcting the reconstructed product design CAD data will be described referring to FIG. 4. FIG. 4 is a sectional view of a center pillar after reconstruction of the product design CAD data. Because the configuration of the center pillar is similar to that of FIG. 3, it will not be explained in detail here. A solid line of FIG. 4 indicates a design surface of the corrected design. For correction of the reconstructed product design CAD data, an outer surface along the design surface of the initial design is corrected to that along the design surface of the corrected design while restricting conditions such as the thick plate setting C+α of the reinforcing material 220, and the space W1−α between the outer portion 200 and the reinforcing material 220 are satisfied.

Returning to FIG. 2, the product design CAD data database 90 stores the product design CAD data in association with the product to be designed.

Figure 5:
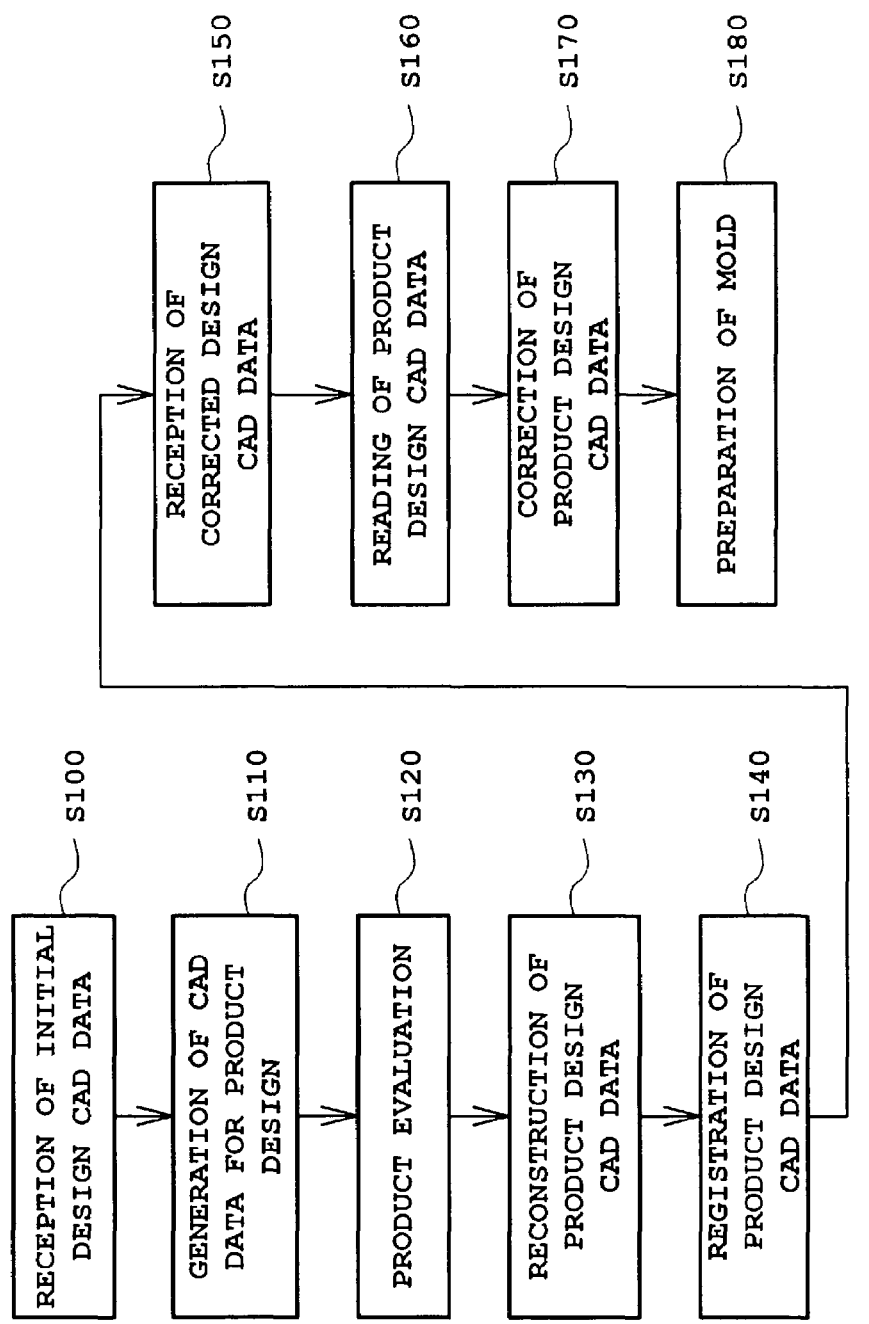
FIG. 5 is a view showing a vehicle design procedure of the embodiment.

FIG. 5 shows a vehicle design procedure of the embodiment. First, CAD data of an initial design as a basis is received (S100). Based on this initial design, product design of each component is performed to generate CAD data for product design (S110). Then, by using the CAD data for product design, structural analysis, mold design evaluation, process/equipment evaluation, and the like are carried out (S120). The CAD data for product design is reconstructed (S130). In this case, the restrictive conditions are added as a parameter to the product design CAD data. The reconstructed product design CAD data is stored in the product design CAD data database 90 in association with the product (S140). Here, an improvement on a design surface progresses, and a new design (corrected design) obtained by correcting the initial design is received (S150). Then, the product design CAD data (reconstructed product design data obtained for the initial design) is read from the product design CAD data database 90 (S160). Subsequently, the read product design CAD data is corrected along a design surface of the corrected design (S170). If the corrected design is a final design, a mold is prepared based on the corrected product design CAD data (S180).

As described above, for generation of the product design CAD data for the corrected design, because the reconstructed product design CAD data incorporating the result of product evaluation is used for the initial design, it is not necessary to execute any new product evaluation for the corrected design. Thus, the process up to the preparation of the mold can be simplified, increasing efficiency and reducing costs.

Furthermore, for the corrected design (design obtained by correcting the initial design), the obtained product design CAD data may be prestored in the product design CAD data database 90 and, if the corrected design is further corrected, the product design CAD data for the corrected design may be read, and corrected along a new design surface. That is, the process, which includes the steps of registering obtained product design CAD data in the product design CAD data database 90 for each correction of the design, reading the product design CAD data for the design of one generation ago (just before current correction) at next correction of the design, and correcting the product design CAD data along the corrected design surface, may be repeated until a final design is created.

As apparent from the foregoing, according to the present invention, when creating the final design after the correction of the product design, it is possible to simplify the process from the creation of the product corrected design to the execution of the product design including the structural analysis.

Next, description will be made of a preferred embodiment in which two components are to be joined in a product.

Figure 6:
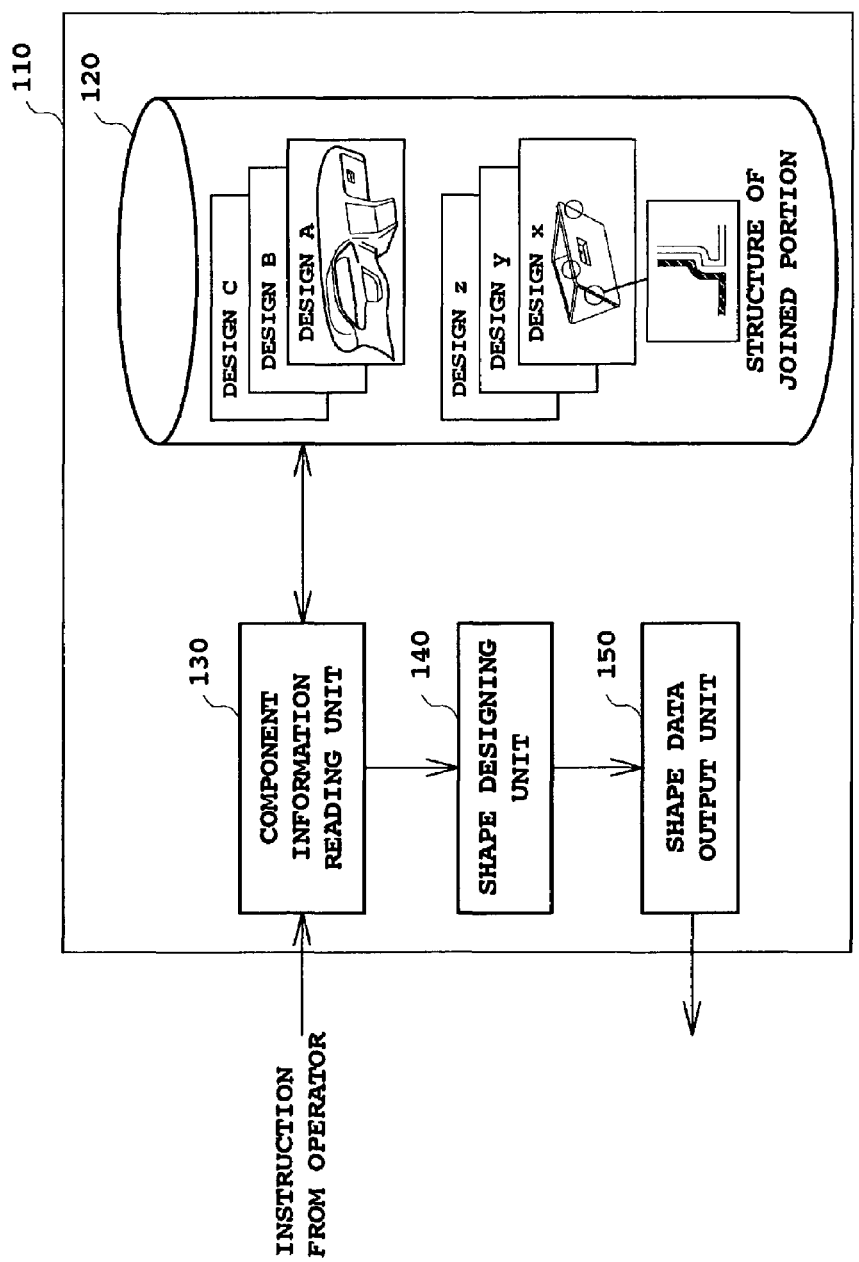
FIG. 6 is a block diagram showing a configuration of a product design system 110 according to another embodiment of the present invention.

FIG. 6 is a block diagram showing a configuration of a product design system 110 according to another embodiment of the present invention. The product design system 110 includes a standard structure database 120, component information reading unit 130, a shape designing unit 140, and a shape data output unit 150.

The standard structure database 120 includes one or more standard component models for each component of a product. Each standard component model stores information regarding a structure of the component (standard structure data), and information regarding a procedure for designing the component (design procedure parameter). Components constituting the product are, for example, an instrument panel main body (instrument panel, hereinafter), a glove box, an ashtray, a cup holder attached to the instrument panel, and the like. For each component, the above-described standard structure data and design procedure parameter are stored.

Examples of standard component models of the instrument panel include, for example, a urethane foam instrument panel, a resin instrument panel, a partial urethane foam instrument panel, and the like. Standard component models available for the glove box can be classified into, for example, those integrating inner and outer portions, and those separating inner and outer portions (separate type). Further, the separate type can be further classified into an outer surface type having a structure of a surface layer/foam layer/core material, and an outer resin type made of a resin, depending on an outer structure.

Figure 7:
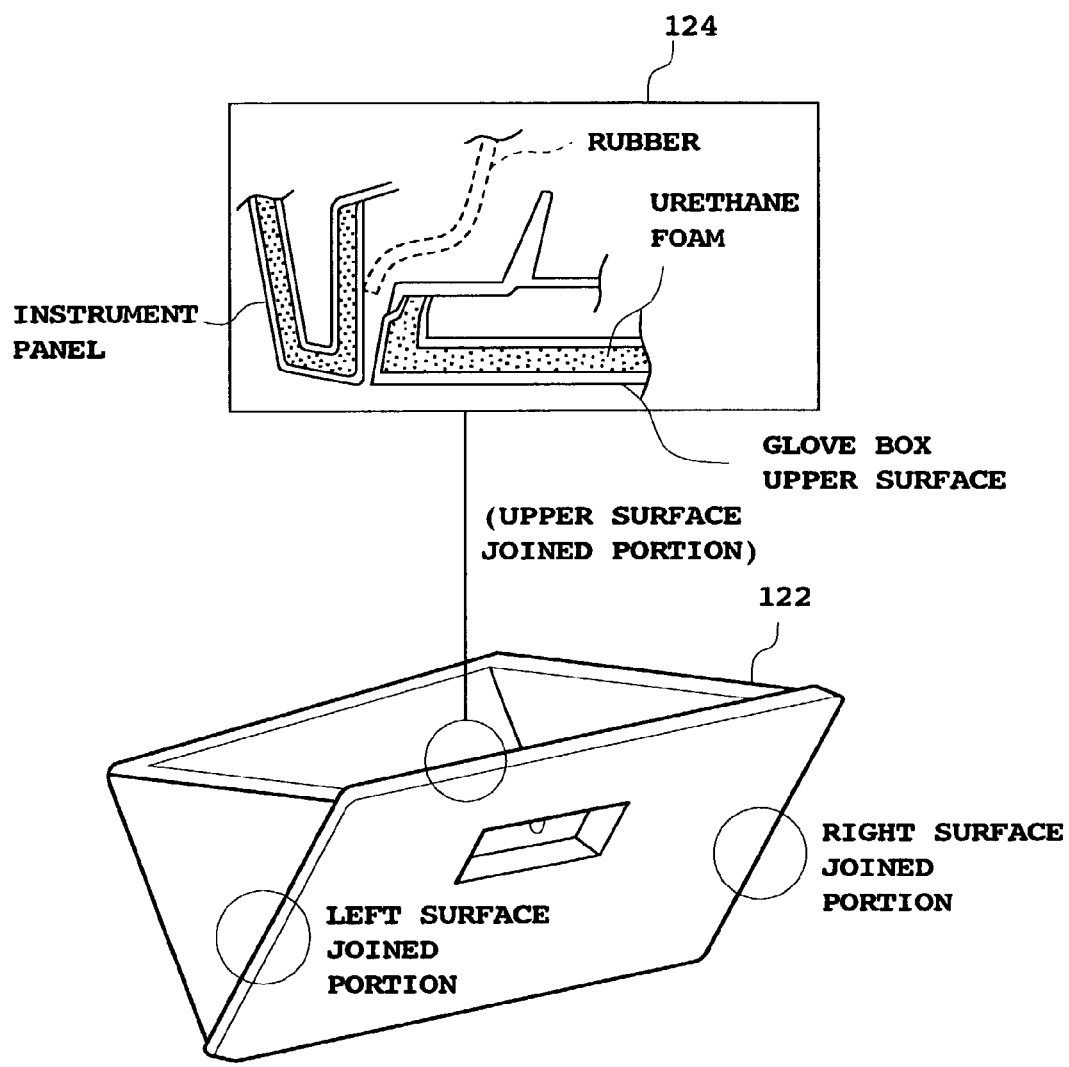
FIG. 7 is a view showing information 124 of a glove box upper surface continuous part structure set in a glove box 122.

For a component having a joined portion (portion laminated by a locking mechanism or the like) with another component, for example, a glove box attached to the instrument panel, information regarding a structure of a continuous part of the joined portion with the other component (continuous part structure information, hereinafter) is contained for each standard component model of each component. Specifically, as shown in FIG. 7, in the case of a glove box 122, continuous part structure information is defined for each of left, right, and upper surfaces. For example, for the upper surface of the glove box 122, the continuous part structure information (glove box upper surface continuous part structure information 124) includes a continuous sectional structure of the upper surface of the glove box 122, and a continuous sectional structure of the instrument panel joined with the closed glove box 122.

An operator can properly refer to the above-described data stored in the standard structure database 120 to select a component used for a product.

Referring again to FIG. 6, the component information reading unit 130 reads the standard structure data, the design procedure parameter, and the continuous part structure information for each component of the product from the standard structure database 120 according to an instruction from the operator.

The shape designing unit 140 executes product design, and generates shape data of the product based on the standard structure data, the design procedure parameter, and the continuous part structure information read by the component information reading unit 130. In the above-described example of the instrument panel and the glove box, first, the standard structure data of the joined portion of the instrument panel is corrected according to the continuous part structure information defined in the glove box. Then, product design is carried out based on the design procedure parameter of the instrument panel and the glove box. Accordingly, if there are two components to be joined together, a continuous structure of the joined portion of the other component is defined by just defining the structure of one component. Thus, time and labor of correcting the structure of the other component to match the structure of one component can be omitted, making it possible to shorten the time necessary for product design, and to thereby reduce costs.

The shape data output unit 150 outputs the shape data of the product generated by the shape designing unit 140 to an external storage medium such as a hard disk.

As apparent from the foregoing, according to the present invention, if there are two components to be joined together in the product, when a shape of one component is decided, a shape of the other component can be automatically decided. Thus, it is possible to shorten product design time.

Generally, in structure design of a product using a 3-dimensional CAD device, correction of 3-dimensional CAD data is repeated until a final structure has been decided. Regarding correction of 3-dimensional CAD data, Japanese Patent Application Laid-Open No. 6-149944 discloses a technology for generating new 3-dimensional CAD data following a positional change of a control point on 3-dimensional CAD data.

In a conventional 3-dimensional CAD device, in generation of new 3-dimensional CAD data carried out by correcting 3-dimensional CAD data, the new 3-dimensional CAD data often has a structure which does not fulfill various conditions of production technology. An example condition of the production technology would be a case of setting a predetermined upper limit for a thickness of a resin material in order to prevent occurrence of surface sinking when the resin member is injection-molded.

Now, description will be made of a preferred embodiment to solve the above-described problem.

Figure 8:
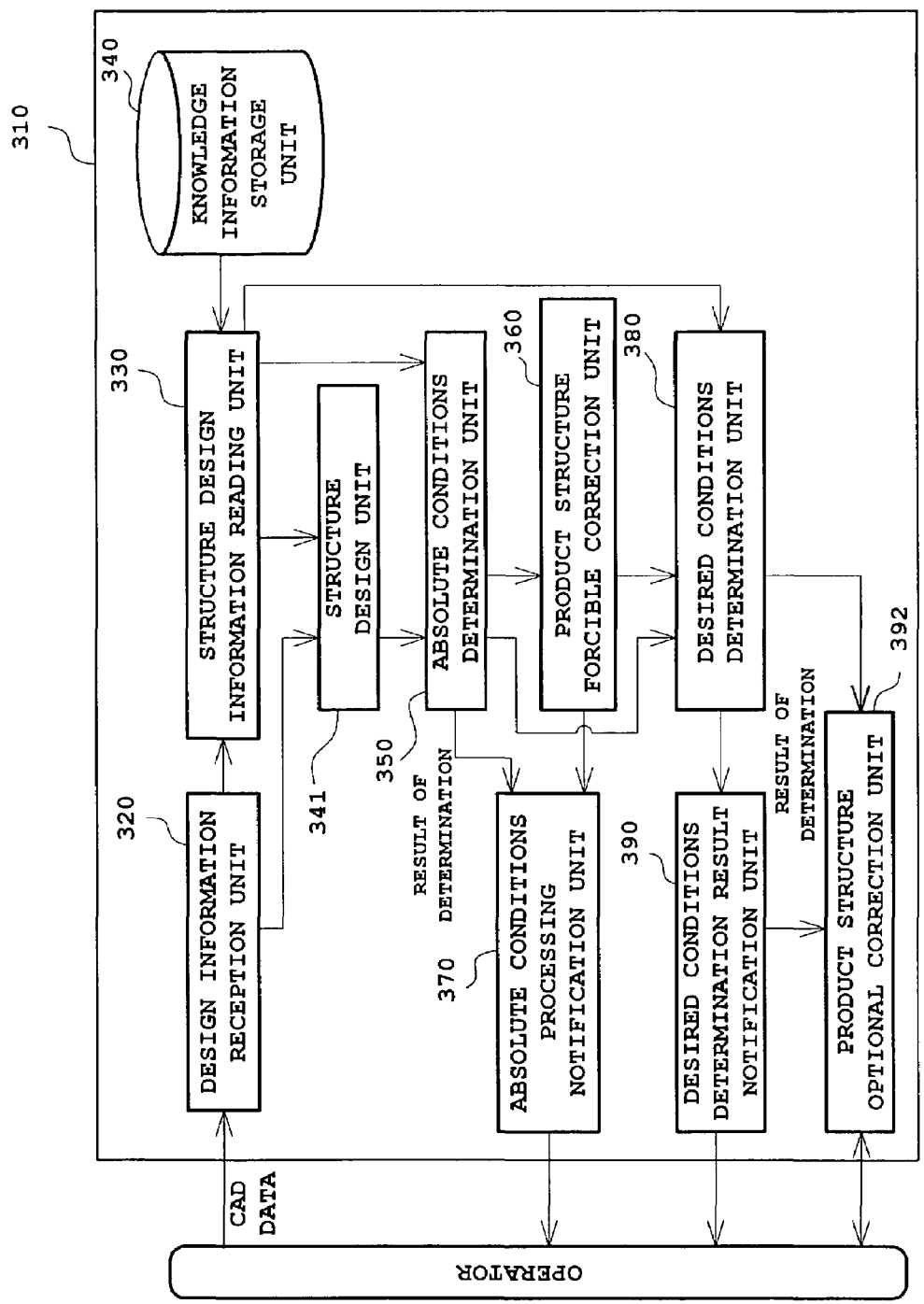
FIG. 8 is a block diagram showing a configuration of a product design system 310 according to yet another embodiment of the present invention.

FIG. 8 is a block diagram showing a configuration of a product design system 310 according to yet another embodiment of the present invention.

The product design system 310 includes a design information reception unit 320, a structure design information reading unit 330, a knowledge information storage unit 340, a structure designing unit 341, an absolute conditions determination unit 350, a product structure forcible correction unit 360, an absolute conditions processing notification unit 370, a desired conditions determination unit 380, a desired conditions determination result notification unit 390, and a product structure optional correction unit 392.

The design information reception unit 320 receives design information containing design CAD data of a product and information (name of a structure included in the product, a product material or the like) accompanying the product input by an operator through an input device such as a keyboard or a mouse, not shown.

The structure design information reading unit 330 reads information (design procedure information, absolute conditions, and desired conditions, which shall be described below) necessary for structure designing from the knowledge information storage unit 340 based on the design information received from the design information reception unit 320. The read information is stored in a memory (not shown), and properly set in a usable state.

The knowledge information storage unit 340 stores design procedure information for designing each product, and various conditions to be met by a structure of each product. Examples of the various conditions are product design conditions for satisfying predetermined specification and performance of the product, and production technology conditions for satisfying restrictions on a production technology in real production of the product. These conditions are classified into conditions (absolute conditions) which must absolutely be fulfilled by the structure of the product and conditions (desired conditions) which should preferably be met by the structure of the product. FIG. 9 shows a restrictive conditions table 342 stored in the knowledge information storage unit 340. The restrictive conditions table 342 stores information regarding the restrictive conditions, a reason of the restrictions, and a type of the restrictive conditions (absolute or desired conditions) for each combination of a structure included in the product and a material to be used. For example, for a rib, in the case of a material ABS, because of a possibility of surface sinking prevention in injection molding, conditions of a rib base plate thickness $W \leq 0.6 \times$ substrate plate thickness T is set as the desired conditions.

Referring again to FIG. 8, the structure designing unit 341 executes structure design along a design surface indicated by the design CAD data received by the design information reception unit 320 according to the design procedure information read by the design information reading unit 330, thereby generating structure designing CAD data.

The absolute conditions determination unit 350 reads the absolute conditions stored in a memory, determines whether the structure designing CAD data created by the structure design information reading unit 330 fulfills the absolute conditions or not, and outputs a result of the determination. If the structure designing CAD data does not fulfill the structure designing CAD data, the structure designing CAD data is sent together with the absolute conditions to the product structure forcible correction unit 360, which is described below. If the structure designing CAD data fulfills the absolute conditions, the structure designing CAD data is sent to the desired conditions determination unit 380, which is also described below.

When the absolute conditions determination unit 350 determines that the structure designing CAD data does not fulfill the absolute conditions, the product structure forcible correction unit 360 receives the structure designing CAD data and the absolute conditions, and forcibly corrects the structure designing CAD data to fulfill the absolute conditions.

The absolute conditions processing notification unit 370 receives the determination result of the absolute conditions from the absolute conditions determination unit 350, and information regarding the forcible correction processing from the product structure forcible correction unit 360, displays the information on a display (not shown), and then notifies the determination result of the absolute conditions, and the corrected content of the structure designing CAD data based on the same, to the operator.

The desired conditions determination unit 380 receives the structure designing CAD data forcibly corrected by the product structure forcible correction unit 360, or the structure designing CAD data determined to meet the absolute conditions by the absolute conditions determination unit 350, and reads the desired conditions stored in the memory. Then, the desired conditions determination unit 380 determines whether or not the received structure designing CAD data fulfills the desired conditions, and outputs a result of the determination.

The desired conditions determination result notification unit 390 notifies the operator of the determination result of the desired conditions by the desired conditions determination unit 380.

When the desired conditions determination unit 380 determines that the structure designing CAD data does not meet the desired conditions, the product structure optional correction unit 392 selects correction or noncorrection of the structure designing CAD data, and executes correction processing for the structure designing CAD data when necessary. The correction processing of the structure designing CAD data may be manually operated by the operator. However, suggestions of structure designing CAD data which would fulfill the desired conditions may be presented to the operator, and selected by the operator.

Figure 10:
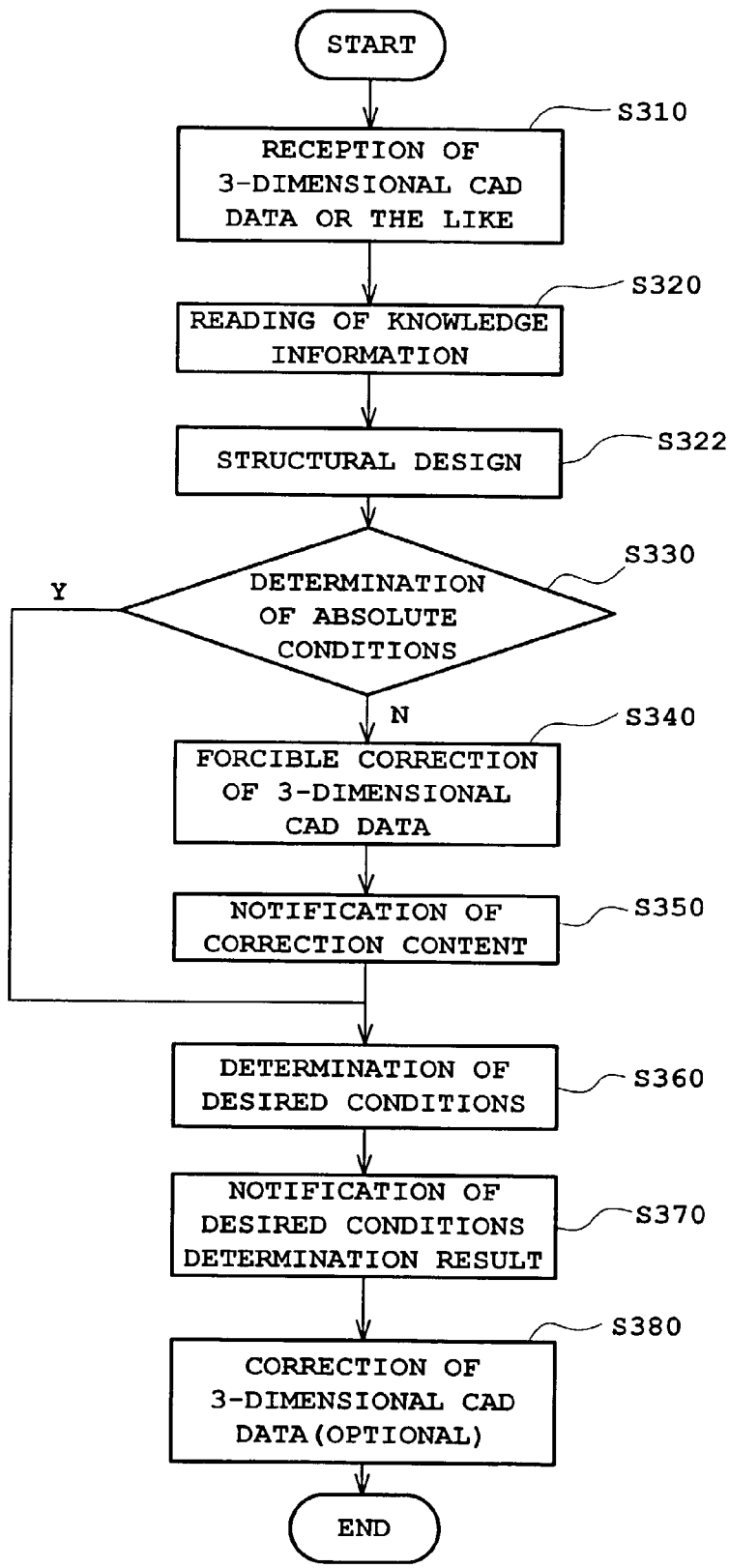
FIG. 10 is a flowchart showing an operation of the product design system 310.

Next, description will be made of an operation of the product design system 310 by referring to the flowchart of FIG. 10.

Product design data (3-dimensional design CAD data), and information regarding a structure name, a material to be used, or the like contained in the design data are received (S310). Based on the received information regarding the structure name, the material, or the like, design procedure information, and knowledge information containing absolute conditions and desired conditions are read from the knowledge information storage unit 340, and stored in a memory or the like (S320). Based on the received 3-dimensional design CAD data and the design procedure information, product structure data (3-dimensional structure designing CAD data) is generated (S322). Then, determination is made as to whether the generated 3-dimensional structure designing CAD data fulfills the absolute conditions or not (S330). If it is determined that the 3-dimensional structure design CAD data does not meet the absolute conditions, the 3-dimensional structure design CAD data is forcibly corrected (S340). After the forcible correction of the 3-dimensional structure designing CAD data, its content is notified to the operator (S350). If the absolute conditions determination (S330) shows that the 3-dimensional structure designing CAD data fulfills the absolute conditions, determination is made as to whether or not the 3-dimensional structure design CAD data fulfills the desired conditions or not (desired conditions determination, S260). When the 3-dimensional structure designing CAD data is forcibly corrected (S340), and then notified (S350), desired conditions determination is carried out for the forcibly corrected 3-dimensional structure designing CAD data (S360). Subsequently, information such as a result of the desired conditions determination, and a reason for the setting of the desired conditions are notified to the operator (S370). The operator then determines whether or not to correct the 3-dimensional structure designing CAD data based on the notified information and corrects the 3-dimensional structure designing CAD data when necessary (S280).

Figure 11:
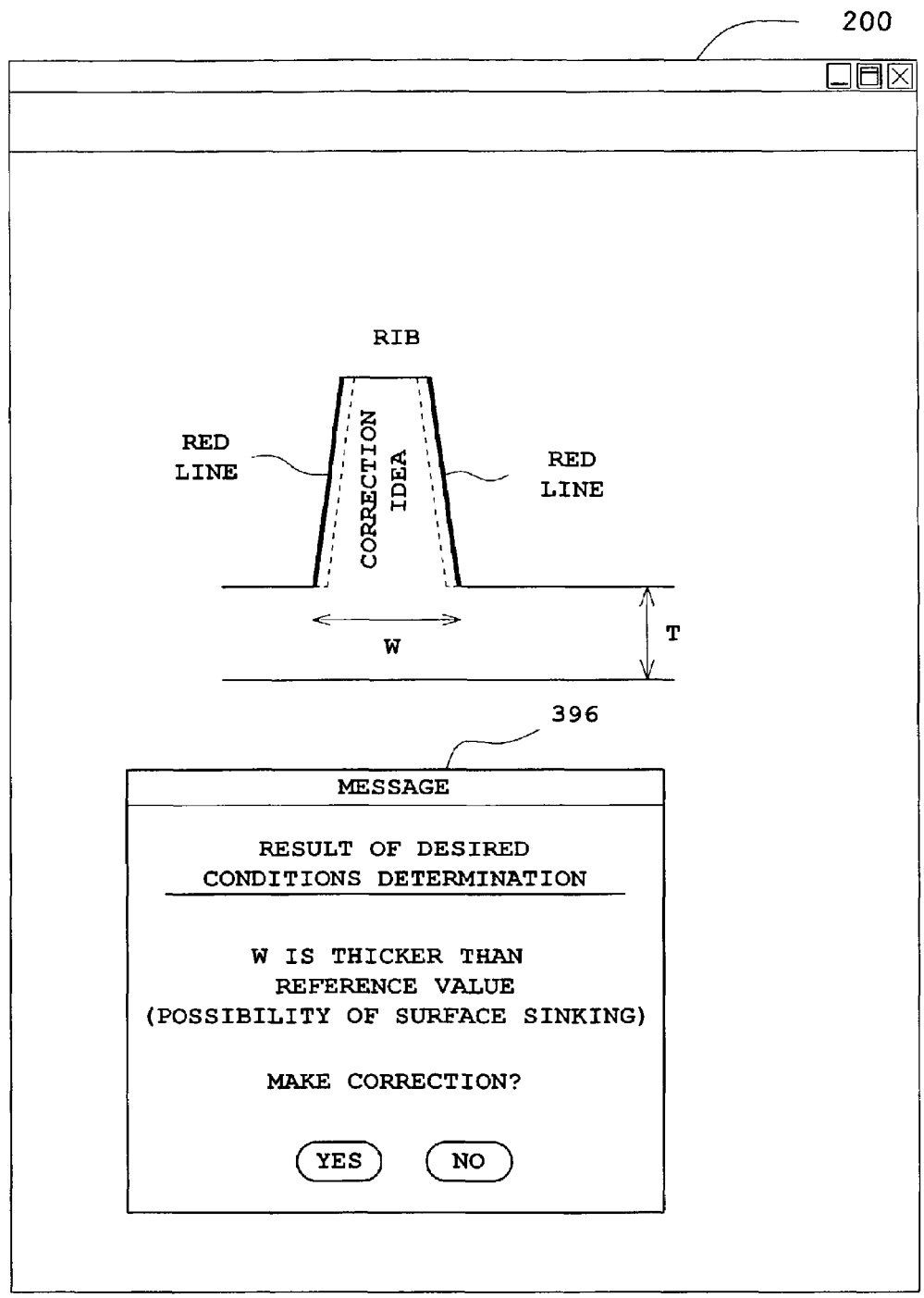
FIG. 11 is a view showing a determination result screen displaying a determination result of desired conditions.

FIG. 11 shows a determination result screen 394 displaying a determination result of the desired conditions. On the determination result screen 394, a product structure targeted for determination is shown. If there is a part not meeting the desired conditions, a line type, color, or thickness of this part is displayed in a form different from those of other parts. Accordingly, the part not meeting the desired conditions is displayed to be easily understood. Further, a correction idea (dotted line of FIG. 11) for correcting the part to meet the desired conditions is displayed.

On the determination result screen 394, a message screen 396 is also displayed. The message screen 396 displays the determination result of the desired conditions, and a problem occurring when an original idea of a product structure is maintained. Thus, the operator can quickly understand the significance of a problem, and use this as information for determining whether or not to make correction to fulfill the desired conditions.

Also, the message screen 396 displays a select button for making selection as to whether or not to change the presented correction idea. Accordingly, when correction is determined to be necessary, the operator can correct the product structure without any additional time or labor.

As apparent from the foregoing description, according to the present invention, it is possible to perform an efficient product design in consideration of the restrictive conditions of the product structure.

Conventionally, design of a product 3-dimensional structure has been carried out using a 3-dimensional CAD device.

Such 3-dimensional CAD devices have also been used in the design of a mold used for product manufacturing. A mold of a product is prepared based on the mold design.

However, the product structure designing and the mold design by the 3-dimensional CAD are separate processes. A change in the product structure designing necessitates re-execution of mold designing. Consequently, a period of product development has been prolonged, increasing costs.

Now, a preferred embodiment for solving the above-described problem will be described.

Figure 12:
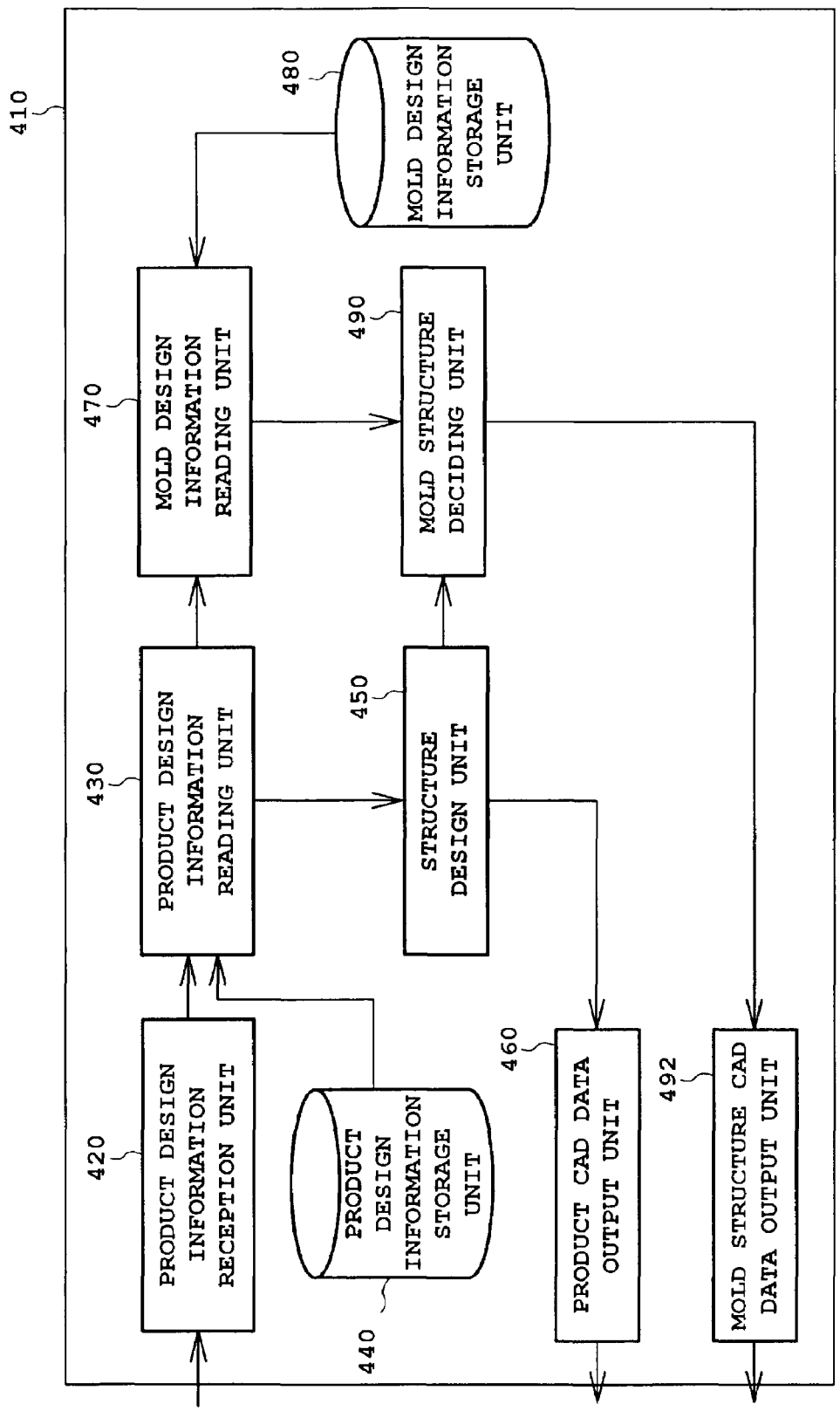
FIG. 12 is a block diagram showing a configuration of a product design system 410 according to a further embodiment of the present invention.

FIG. 12 is a block diagram showing a configuration of a product design system 410 according to a further embodiment. The product design system 410 includes a product design information reception unit 420, a product design information reading unit 430, a structure design unit 450, a product CAD data output unit 460, a mold design information reading unit 470, a mold design information storage unit 480, a mold structure deciding unit 490, and a mold structure CAD data output unit 492.

The product design information reception unit 420 receives design CAD data indicating a design of a product, and a product name for specifying a standard basic structure of the product through a not-shown input device such as a keyboard or a mouse.

The product design information reading unit 430 reads procedure information (product design parameter) for designing the product, and information regarding a component such as a boss rib used for the product from the later-described product design information storage unit 440 according to the product name received by the product design information reception unit 420. Also, a product ID corresponding to the product name is read, and sent to the later-described mold design information reading unit 470.

The product design information storage unit 440 includes a product table 442, and a component table 444. The product table 442 stores the product name and procedure information (product design parameter) for designing the product in association with information for identifying the product (product ID) (see FIG. 13). For example, instrument panels have different specifications of instrument panels A to D (product ID (S001 to S004)), and current product design parameters are associated with one another. Each product design parameter contains information (component ID) for identifying a component to be used such as a boss rib, and indicates a standard position for installing the component.

Figure 14:
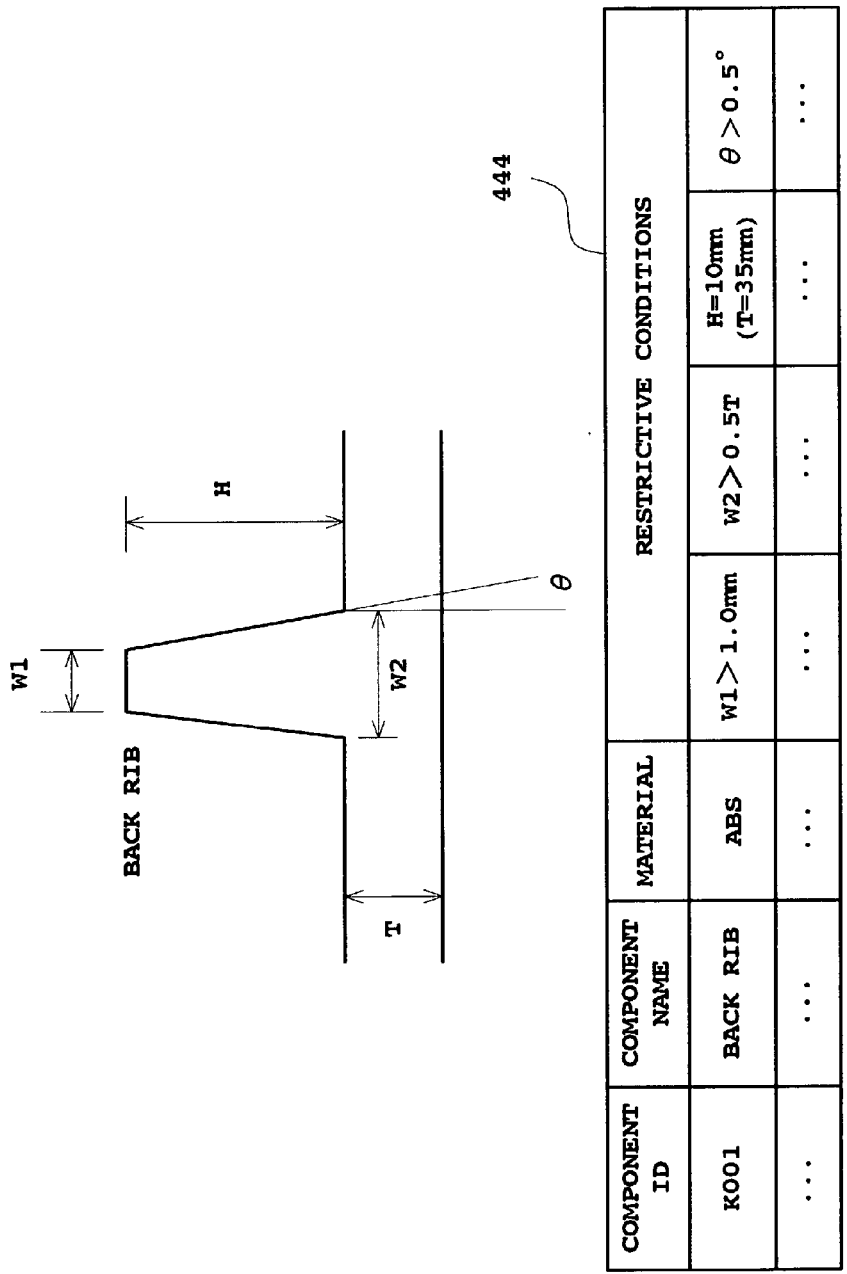
FIG. 14 is a view showing an example of a component table 444 included in the product design information storage unit 440.

The component table 444 stores design information regarding the restrictive conditions or the like of a production technology according to a component and a material to be used in association with the information (component ID) for identifying the component such as a boss rib (see FIG. 14).

The structure design unit 450 designs a product structure based on the design CAD data received by the product design information reception unit 420, the product design parameter read by the product design information storage unit 440, and the design information of the component such as a boss rib, arranges necessary components, and generates a product CAD data indicating the structure of the product. Information regarding the arrangement of the component decided herein is sent to the mold structure deciding unit 490.

The product CAD data output unit 460 outputs the product CAD data generated by the structure design unit 450 to an external memory (not shown).

The mold design information reading unit 470 reads design information of a mold necessary for manufacturing the product from the later-described mold design information storage unit 480 according to the product ID read by the product design information reading unit 430.

The mold design information storage unit 480 includes a standard mold table 482 and a mold component table 484. The standard mold table 482 stores a layout data mold necessary for manufacturing the product, and information (mold component ID) for identifying a mold component in association with the product ID (see FIG. 15). Based on these tables, a mold standard structure is obtained for each product.

The mold component table 484 stores a mold component name, an individual name, and a mold design parameter in association with the mold component ID (see FIG. 16). For example, in the case of an undercut processing mold structure component A (slide core), the mold design parameter defines an undercutting amount, a slide stroke amount, an inclining angle of the slide core, or the like.

According to the components arranged by the structure design unit 450, the mold structure deciding unit 490 arranges mold components for the standard structure of a mold corresponding to the components, and generates mold structure CAD data indicating the mold used for manufacturing the product.

The mold structure CAD data output unit 492 outputs the mold structure CAD data generated by the mold structure deciding unit 490 to the external memory.

Figure 17:
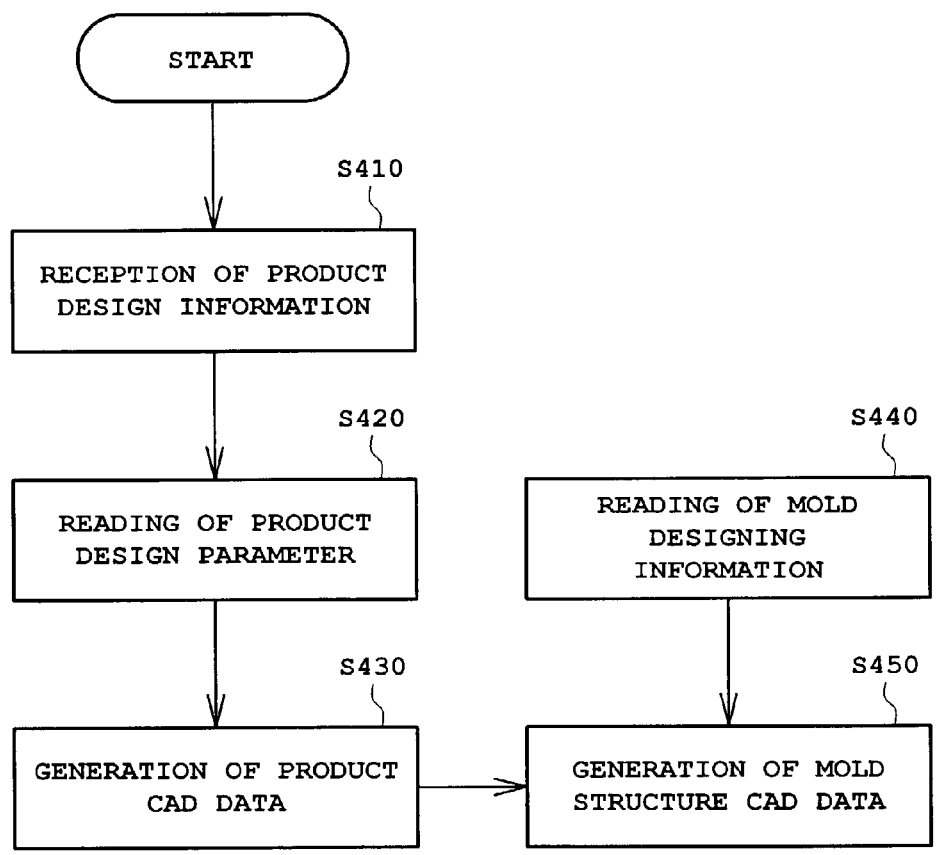
FIG. 17 is a flowchart showing an operation of the product design system 410.

Next, description will be made of an operation of the product design system 410. FIG. 17 is a flowchart showing the operation of the product design system 410. First, product design information (design CAD data indicating a design of a product, and its product name) is received from the operator (S410). Based on the received product design information, product ID, a product design parameter for the product, and design information on a component such as a boss rib are read from the product design information storage unit 440 (S420). Here, the design information of the component preferably contains restrictive conditions of a production technology. Subsequently, based on the design CAD data, the product design parameter, and the information of the component, product CAD data indicating a structure of the product is generated (S430). If the design information of the component contains the restrictive conditions of the production technology, product CAD data which meets the restrictive conditions is generated.

On the other hand, concurrently with the reading of the product design parameter, based on the product ID read from the product design information storage unit 440, information (mold design parameter) regarding a standard structure of a mold necessary for manufacturing the product is read from the mold design information storage unit 480 (S440). Subsequently, according to arrangement of components contained in the generated product CAD data, mold components corresponding to the components are arranged in the standard mold structure of the product, and mold structure CAD data is generated (S450). If the design information of the component contains the restrictive conditions of the production technology, mold structure CAD data to be generated automatically becomes data which meets the restrictive conditions.

For each product, design information of each product, and design information on a mold for manufacturing each product are provided and, by executing product design and mold design in association, a mold structure is uniquely decided following a progress of the product design. Thus, a process of from the product design to the mold designing can be greatly shortened, reducing costs.

As apparent from the foregoing description, according to the present invention, it is possible to shorten the process time from the product design to the mold design.

What is claimed is:

1. A product design system for performing structure designing of a product, comprising:
    an initial design reception unit for receiving initial design information of the product;
    a product design information generation unit for generating product design information containing design procedure information and a structure of the product based on the initial design information and the design procedure information for defining a design procedure of the product;
    product evaluating means for evaluating the product based on the product design information;
    a product design information reconstruction unit for reconstructing the product design information to fulfill restrictive conditions for the structure of the product defined by the production evaluation, and adding the restrictive conditions to the design procedure information;
    a corrected design reception unit for receiving corrected design information obtained by adding correction to the initial design information;
    a product design information reading unit for reading the reconstructed product design information; and
    a product design information correction unit for correcting the reconstructed product design information to fulfill the restrictive conditions based on the corrected design information.

2. The product design system according to claim 1, wherein the product evaluation includes manufacturing evaluation of the product, and the restrictive conditions include conditions set according to a result of the manufacturing evaluation of the product.

3. The product design system according to claim 1 or 2, further comprising a standard structure database containing design information for designing a component associated with each component constituting the product, and continuous part structure information associated with a reference component to be joined together to define a structure of a joined portion between the reference component and an opposite component to be joined with the reference component, a component information reading unit for reading the design information regarding the component constituting the product, and the continuous part structure information associated with the component having the joined portion among the components constituting the product from the standard structure database, and a product design unit for forming a product structure replacing the structure of the opposite component based on the design information and the continuous part structure information read by the component information reading unit.

4. The product design system according to claim 1 or 2, further comprising:
    a design information reception unit for receiving design information of a predetermined product,
    a product structure information storage unit for storing design procedure information for designing the product and restrictive conditions for the structure of the product, for each product, a product design information reading unit for reading the design procedure information for the predetermined product, and the restrictive conditions from the product structure information storage unit, a structure design unit for designing a structure according to the design information and the corresponding design procedure information, a restrictive conditions determination unit for determining whether or not the product design structure designed by the structure design unit fulfills the restrictive conditions, and a restrictive conditions determination result notification unit for communicating a result of the determination made by the restrictive conditions determination unit to a user.

5. The product design system according to claim 4, wherein
the restrictive conditions include absolute conditions for the structure of the product, and
a product structure forcible correction unit is further provided for forcibly correcting the product design structure to fulfill the absolute conditions when the conditions determination unit determines that a structure included in the product design structure does not fulfill the absolute conditions on the structure of the product.

6. The product design system according to claim 4, wherein
the restrictive conditions include desired conditions for defining restrictive conditions desired for the structure of the product, and
a product structure optional correction unit is further provided for prompting the user to select correction/noncorrection of the product design structure when the conditions determination unit determines that a structure included in the product design structure does not fulfill the desired conditions for the structure of the product.

7. The product design system according to claim 4, further comprising
a design information reception unit for receiving design information of a predetermined product,
a conditions storage unit for storing, for each product, design procedure information for designing the product, absolute conditions for defining absolute conditions for the structure of the product, and desired conditions for defining conditions desired for the structure of the product,
a product design information reading unit for reading the design procedure information for the predetermined product, the absolute conditions, and the desired conditions from the product structure information storage unit,
a structure designing unit for designing a structure in accordance with the design information and the corresponding design procedure information,
an absolute conditions determination unit for determining whether or not the product design structure designed by the structure designing unit fulfills the absolute conditions,
a product structure forcible correction unit for forcibly correcting the product design structure to fulfill the absolute conditions when the absolute conditions determination unit determines that a structure included in the product design structure does not fulfill the absolute conditions for the structure of the product, a desired conditions determination unit for determining whether or not the product design structure determined to fulfill the absolute conditions, or the structure included in the product design structure corrected by the product structure forcible correction unit fulfills the desired conditions, a desired conditions determination result notification unit for communicating a determination result by the desired conditions determination unit to a user, and a product structure optional correction unit for prompting the user to select correction/noncorrection of the product design structure when the desired conditions determination unit determines that the product design structure determined to fulfill the absolute conditions, or the structure included in the product design structure corrected by the product structure forcible correction unit does not fulfill the desired conditions for the structure of the product.

8. The product design system according to claim 1 or 2, further comprising a product design information storage unit for storing, for each product, product design information for designing the product, and component designing information for a component used for the product, a mold design information storage unit for storing, for each product, mold design information for designing a mold for manufacturing the product, a design information reading unit for reading the product design information and the component design information from the product design information storage unit according to the product to be designed, a structure design unit for arranging components and designing a structure of the product according to the product design information, and the component designing information, a design information reading unit for reading the mold design information from the mold design information storage unit according to the product to be designed, and a mold structure deciding unit for deciding a structure of the mold of the product according to the mold design information and arrangement of the components by the structure design unit.

9. The product design system according to claim 8, wherein the component designing information includes restrictive conditions for production of a component, and the mold structure deciding unit decides a mold structure which fulfills the conditions.

10. A product design method for performing structure designing of a product, comprising:
a product design information generation step of generating product design information containing design procedure information and a structure of the product based on initial design information of the product, and design procedure information for defining a design procedure of the product;
a conditions acquisition step of acquiring restrictive conditions on a structure of the product by executing product evaluation for the product design information;
a product design information reconstruction step of reconstructing the product design information to fulfill the restrictive conditions by adding the restrictive conditions to the design procedure information contained in the product design information; and
a product design information correction step of correcting the reconstructed product design information based on corrected design information obtained by correcting the initial design information, and the restrictive conditions.

11. The product design method according to claim 10, further comprising a step of re-correcting the product design information corrected based on the corrected design information, based on re-corrected design information obtained by re-correcting the corrected design information when the correction is added again to the corrected design information.

12. The product design method according to claim 10 or 11, further comprising a component information reading step of reading design information regarding the component constituting the product, and a continuous part structure information associated with a component having a joined portion among the components constituting the product from a standard structure database, the database containing design information for designing a component associated with each component constituting the product, and continuous part structure information associated with a reference component to be joined together to define a structure of the joined portion between the reference component and an opposite component to be joined with the reference component, and a product design step of forming a product structure replacing the structure of the opposite component based on the design information and the continuous part structure information read by the component information reading step.

13. The product design method according to claim 10 or 11, further comprising
 a design information reception step of receiving design information of a predetermined product,
 a product design information reading step of reading the design procedure information for the predetermined product, and the restrictive conditions from a product structure information storage unit for storing, for each product, the design procedure information for designing the product, and the restrictive conditions for a structure of the product,
 a structure designing step of designing a structure according to the design information and the corresponding design procedure information,
 a restrictive conditions determination step of determining whether the product design structure designed by the structure design step fulfills the restrictive conditions or not, and
 a restrictive conditions determination result notification step of communicating a result of the determination made by the restrictive conditions determination step to a user.

14. The product design method according to claim 13, wherein
 the restrictive conditions contain absolute conditions for the structure of the product, and
 a product structure forcible correction step is further provided for forcibly correcting the product design structure to fulfill the absolute conditions when the conditions determination step determines that a structure included in the product design structure does not fulfill the absolute conditions for the structure of the product.

15. The product design method according to claim 13, wherein
 the restrictive conditions includes desired conditions for defining conditions desired for the structure of the product, and
 a product structure optional correction step is further provided for causing the user to select correction/ noncorrection of the product design structure when the restrictive conditions determination step determines that a structure included in the product design structure does not fulfill the desired conditions for the structure of the product.

16. The product design method according to claim 10 or 11, further comprising a designing information reading step of reading product design information and component designing information according to the product to be designed from a product design information storage unit for storing, for each product, the product design information for designing the product, and the component designing information regarding components to be used for the product; a structure design step of arranging the components and designing a structure of the product according to the product design information and the component design information; a design information reading step of reading mold designing information according to the product to be designed from a mold design information storage unit for storing, for each product, the mold design information for designing a mold of the product; and a mold structure deciding step of deciding a structure of the mold of the product according to the mold design information and arrangement of the components by the structure design step.

17. The product design method according to claim 16, wherein the component design information includes restrictive conditions for production of a component, and the mold structure deciding step decides a mold structure which fulfills the restrictive conditions.

18. A computer-readable recording medium storing a product design program,
 the program comprising:
 a product design information generation step of generating product design information containing design procedure information and a structure of a product based on initial design information of the product, and design procedure information for defining a design procedure of the product;
 a restrictive conditions acquisition step of acquiring restrictive conditions on a structure of the product by executing product evaluation for the product design information;
 a product design information reconstruction step of reconstructing the product design information to fulfill the restrictive conditions by adding the restrictive conditions to the design procedure information contained in the product design information; and
 a product design information correction step of correcting the reconstructed product design information based on corrected design information obtained by correcting the initial design information, and the restrictive conditions.

19. The computer-readable recording medium storing the product design program according to claim 18, the program further comprising:
 a step of re-correcting the product design information corrected based on the corrected design information, based on re-corrected design information obtained by re-correcting the corrected design information when the correction is added again to the corrected design information.

20. The computer-readable recording medium storing the product design program according to claim 18 or 19, the program further comprising:
 a component information reading step of reading design information regarding the component constituting the product, and a continuous part structure information associated with a component having a joined portion among the components constituting the product from a standard structure database, the database containing design information for designing a component associated with each component constituting the product, and the continuous part structure information associated with a reference component to be joined together to define a structure of the joined portion between the reference component and an opposite component to be joined with the reference component, and a product design step of forming a product structure replacing the structure of the opposite component based on the designing information and the continuous part structure information read by the component information reading step.

21. The computer-readable recording medium storing the product design program according to claim 18 or 19, further comprising a design information reception step of receiving design information of a predetermined product, a product design information reading step of reading the design procedure information for the predetermined product, and the restrictive conditions from a product structure information storage unit for storing, for each product, the design procedure information for designing the product, and the restrictive conditions for a structure of the product, a structure designing step of designing a structure according to the design information and the corresponding design procedure information, a restrictive conditions determination step of determining whether or not the product design structure designed by the structure designing step fulfills the restrictive conditions, and a restrictive conditions determination result notification step of communicating a result of the determination made by the restrictive conditions determination step to a user.

22. The computer-readable recording medium storing the product design program according to claim 21, wherein the restrictive conditions include absolute conditions for the structure of the product, and a product structure forcible correction step is further provided for forcibly correcting the product design structure to fulfill the absolute conditions when the restrictive conditions determination step determines that a structure included in the product design structure does not fulfill the absolute conditions on the structure of the product.

23. The computer-readable recording medium storing the product design program according to claim 21, wherein the restrictive conditions include desired conditions for defining conditions desired for the structure of the product, and a product structure optional correction step is further provided for prompting the user to select correction/noncorrection of the product design structure when the restrictive conditions determination step determines that a structure included in the product design structure does not fulfill the desired conditions for the structure of the product.

24. The computer-readable recording medium storing the product design program according to claim 18 or 19, further comprising a design information reading step of reading product design information and component design information according to the product to be designed from a product design information storage unit for storing, for each product, the product design information for designing the product, and the component design information regarding components to be used for the product; a structure designing step of arranging the components and designing a structure of the product according to the product design information and the component design information; a design information reading step of reading mold design information according to the product to be designed from a mold design information storage unit for storing, for each product, the mold design information for designing a mold of the product; and a mold structure deciding step of deciding a structure of the mold of the product according to the mold design information and the arrangement of the components by the structure designing step.

25. The computer-readable recording medium storing the product design program according to claim 24, wherein the component design information includes restrictive conditions for production of a component, and the mold structure deciding step decides a mold structure which fulfills the restrictive conditions.

* * * * *

UNITED STATES PATENT AND TRADEMARK OFFICE
CERTIFICATE OF CORRECTION

PATENT NO. : 7,016,749 B2 Page 1 of 1
APPLICATION NO. : 10/267569
DATED : March 21, 2006
INVENTOR(S) : Kuzumaki et al.

It is certified that error appears in the above-identified patent and that said Letters Patent is hereby corrected as shown below:

Title page, item [57], in the Abstract, line 10, "CAAD" should read --CAD--.

Signed and Sealed this

Fourth Day of July, 2006

JON W. DUDAS
*Director of the United States Patent and Trademark Office*